United States Patent
Gopinath et al.

(10) Patent No.: US 12,532,534 B2
(45) Date of Patent: Jan. 20, 2026

(54) TRANSISTOR ARRAYS WITH CONTROLLABLE GATE VOLTAGE

(71) Applicant: GlobalFoundries U.S. Inc., Malta, NY (US)

(72) Inventors: Venkatesh P. Gopinath, Fremont, CA (US); Navneet Jain, Milpitas, CA (US); Hongru Ren, Mechanicville, NY (US); Alexander Derrickson, Saratoga Springs, NY (US); Jianwei Peng, Clifton Park, NY (US); Bipul C. Paul, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 510 days.

(21) Appl. No.: 18/080,017

(22) Filed: Dec. 13, 2022

(65) Prior Publication Data
US 2024/0194535 A1   Jun. 13, 2024

(51) Int. Cl.
 *H10D 84/03* (2025.01)
 *H01L 21/768* (2006.01)
 (Continued)

(52) U.S. Cl.
 CPC ..... *H10D 84/038* (2025.01); *H01L 21/76895* (2013.01); *H10B 63/34* (2023.02);
 (Continued)

(58) Field of Classification Search
 CPC .............. H10D 84/038; H10D 64/411; H10D 64/663; H10D 84/0149; H10D 86/021;
 (Continued)

(56) References Cited

U.S. PATENT DOCUMENTS

| 7,663,237 B2 | 2/2010 | Peng et al. |
| 8,237,228 B2 * | 8/2012 | Or-Bach ............... G03F 9/7084 |
| | | 257/369 |

(Continued)

FOREIGN PATENT DOCUMENTS

EP   4312479 A1   1/2024

OTHER PUBLICATIONS

European Patent Office; Communication under Rule 71(3) EPC, Intention to Grant issued in European Patent Application No. 23197413.0 on May 23, 2025; 8 pages.

(Continued)

*Primary Examiner* — Yasser A Abdelaziez
(74) *Attorney, Agent, or Firm* — Thompson Hine LLP; Anthony Canale

(57) ABSTRACT

Structures that include field-effect transistors and methods of forming such structures. The structure comprises a substrate, a dielectric layer on the substrate, a first field-effect transistor including a first semiconductor layer over the dielectric layer and a first gate electrode, and a second field-effect transistor including a second semiconductor layer over the dielectric layer and a second gate electrode adjacent to the first gate electrode. The second semiconductor layer is connected to the first semiconductor layer, and the first and second semiconductor layers are positioned between the first gate electrode and the second gate electrode.

19 Claims, 12 Drawing Sheets

(51) Int. Cl.
  *H10B 63/00*    (2023.01)
  *H10D 64/27*    (2025.01)
  *H10D 64/66*    (2025.01)
  *H10D 84/01*    (2025.01)

(52) U.S. Cl.
  CPC ......... *H10D 64/411* (2025.01); *H10D 64/663* (2025.01); *H10D 84/0149* (2025.01)

(58) Field of Classification Search
  CPC .................. H10D 86/421; H10D 86/60; H01L 21/76895; H01L 23/528; H10B 63/34; H10B 63/80; H10B 63/30; G11C 11/1659; G11C 13/003; G11C 2213/74; G11C 2213/79; H10N 70/826; H10N 70/8833; H10N 70/20
  See application file for complete search history.

(56) References Cited

U.S. PATENT DOCUMENTS

| | | | |
|---|---|---|---|
| 8,741,725 B2 | 6/2014 | Johnson et al. | |
| 9,472,272 B2 | 10/2016 | Gopinath et al. | |
| 11,088,022 B2 * | 8/2021 | Tsai | H01L 21/76224 |
| 2008/0153239 A1 | 6/2008 | Su et al. | |
| 2009/0194760 A1 | 8/2009 | Gosain et al. | |
| 2010/0224938 A1 * | 9/2010 | Zhu | H10D 30/0278 |
| | | | 438/285 |
| 2011/0169141 A1 * | 7/2011 | Shepard, Jr. | H10D 84/0167 |
| | | | 257/E21.283 |
| 2012/0007145 A1 * | 1/2012 | Chen | H10D 84/0167 |
| | | | 257/E21.409 |
| 2014/0252503 A1 * | 9/2014 | Chudzik | H01L 21/0234 |
| | | | 257/411 |
| 2019/0363135 A1 | 11/2019 | Majhi et al. | |
| 2022/0020757 A1 | 1/2022 | Kobayashi | |

OTHER PUBLICATIONS

European Patent Office, Extended European Search Report and Opinion issued in European Patent Application No. 23197413.0 on Feb. 22, 2024; 7 pages.

Pritchard, David et al., "Substrates of Semiconductor Devices Having Varying Thicknesses of Semiconductor Layers" filed on Aug. 17, 2022 as a U.S. Appl. No. 17/820,248.

* cited by examiner

TRANSISTOR ARRAYS WITH CONTROLLABLE GATE VOLTAGE

BACKGROUND

This disclosure relates to integrated circuits and semiconductor device fabrication and, more specifically, to structures that include field-effect transistors and methods of forming such structures.

A resistive random-access memory device provides one category of embedded non-volatile memory technology. A bitcell of a resistive random-access memory device typically includes a resistive memory element and an access transistor that controls operations used to write, erase, and read the resistive memory element. Because resistive memory elements are non-volatile, bits of data are retained as stored content by the resistive memory elements when the resistive random-access memory device is unpowered. The non-volatility of a resistive random-access memory device contrasts with volatile memory technologies, such as a static random-access memory device in which the stored content is eventually lost when unpowered and a dynamic random-access memory device in which the stored content is lost unless periodically refreshed.

Field-effect transistors are commonly used as access transistors in a resistive random-access memory device. Voltage and drive current requirements imposed on the field-effect transistors for reliable operation of the bitcell of a resistive random-access memory device impose a limitation on the ability to shrink the dimensions of the field-effect transistors. As a result, the scalability of the bitcell is restricted.

Improved structures that include field-effect transistors and methods of forming such structures are needed.

SUMMARY

According to an embodiment of the invention, a structure comprises a dielectric layer on a substrate, a first field-effect transistor including a first semiconductor layer over the dielectric layer and a first gate electrode, and a second field-effect transistor including a second semiconductor layer over the dielectric layer and a second gate electrode adjacent to the first gate electrode. The second semiconductor layer is connected to the first semiconductor layer, and the first and second semiconductor layers are positioned between the first gate electrode and the second gate electrode.

According to an embodiment of the invention, a method comprises forming a first field-effect transistor including a first semiconductor layer over a dielectric layer and a first gate electrode. The dielectric layer is positioned on a substrate. The method further comprises forming a second field-effect transistor including a second semiconductor layer over the dielectric layer and a second gate electrode adjacent to the first gate electrode. The second semiconductor layer is connected to the first semiconductor layer, and the first and second semiconductor layers are positioned between the first gate electrode and the second gate electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
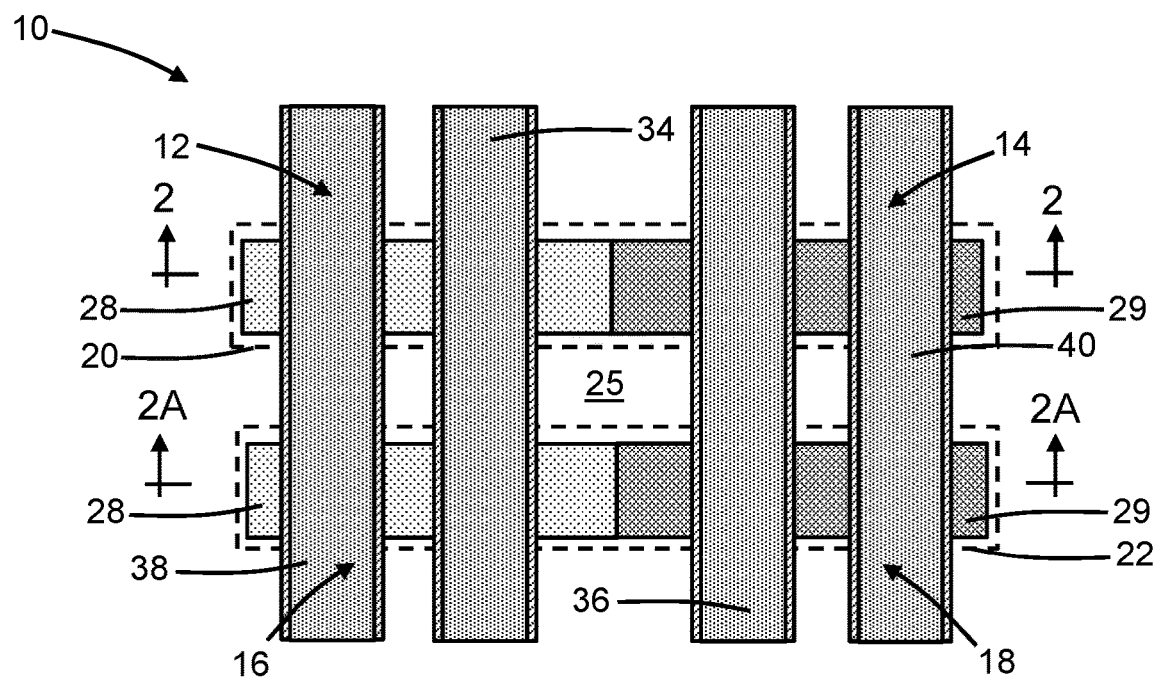
FIG. 1 is a diagrammatic top view illustrating a structure including an array of field-effect transistors at an initial stage of a fabrication method in accordance with embodiments of the invention.
Figure 2:
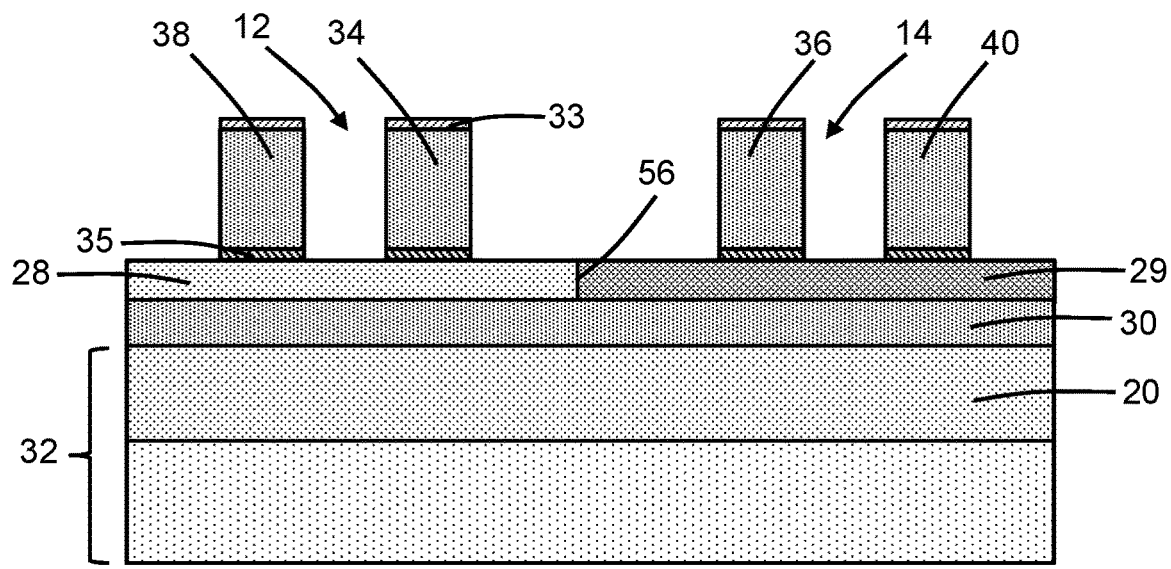
FIG. 2 is a cross-sectional view taken generally along line 2-2 in FIG. 1.
Figure 2A:
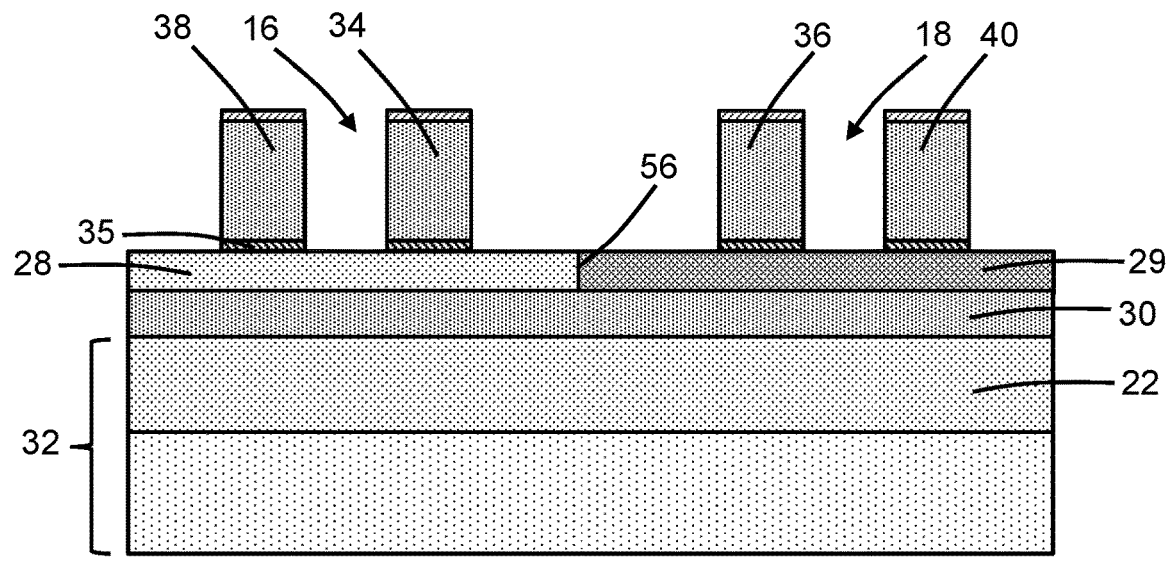
FIG. 2A is a cross-sectional view taken generally along line 2A-2A in FIG. 1.

With reference to FIGS. 1, 2, 2A and in accordance with embodiments of the invention, a structure 10 for a resistive random-access memory device includes an array of field-effect transistors 12, 14, 16, 18 that may be fabricated using a silicon-on-insulator substrate. The silicon-on-insulator substrate may include semiconductor layers 28, semiconductor layers 29 respectively adjacent to the semiconductor layers 28, a substrate 32, and a dielectric layer 30 disposed between the semiconductor layers 28, 29 and the substrate 32. The semiconductor layers 28 may be comprised of a semiconductor material, such as single-crystal silicon, and the semiconductor layers 29 may be comprised of a different semiconductor material, such as single-crystal silicon-germanium. In an embodiment, the semiconductor layers 29 may be formed by a condensation process that modifies a section of single-crystal silicon disposed on the dielectric layer 30 by diffusing germanium from a deposited layer of silicon-germanium into the section of single-crystal silicon. The semiconductor layer 28 and the semiconductor layer 29 in each pair may abut or adjoin along an interface 56, and the semiconductor layers 28, 29 may initially be included in a device layer of the silicon-on-insulator substrate. In an embodiment, each pair of the semiconductor layers 28, 29 may directly contact at the respective interface 56.

The dielectric layer 30 may be comprised of a dielectric material, such as silicon dioxide, that is an electrical insulator. The substrate 32 may be comprised of a semiconductor material, such as silicon, and may be lightly doped with a p-type dopant. The dielectric layer 30 may have an upper interface with the semiconductor layers 28, 29, the dielectric layer 30 may have a lower interface with the substrate 32, and the upper and lower interfaces may be separated by the thickness of the dielectric layer 30. In an embodiment, the semiconductor layers 28, 29 may have a thickness suitable to fabricate fully-depleted silicon-on-insulator (FDSOI) field-effect transistors. In an embodiment, the semiconductor layers 28, 29 may have a thickness in a range of about 2 nanometers (nm) to about 20 nm. In an embodiment, the dielectric layer 30 may have a thickness in a range of about 10 nm to about 50 nm.

Wells 20, 22 may be formed as doped regions in the substrate 32. The wells 20, 22, which are spaced apart, are positioned in a vertical direction beneath the dielectric layer 30. In an embodiment, the wells 20, 22 may longitudinally extend as laterally-spaced stripes of doped semiconductor material, and the well 20 may be aligned parallel to the well 22. The semiconductor material constituting the wells 20, 22 may have an opposite conductivity type from the semiconductor material constituting the substrate 32. The well 20 is positioned in the substrate 32 beneath the pair of the semiconductor layers 28, 29 included in the field-effect transistors 12, 14, and the well 22 is positioned in the substrate 32 beneath the pair of the semiconductor layers 28, 29 included in the field-effect transistors 16, 18.

The wells 20, 22 may be formed in the substrate 32 by introducing a dopant by, for example, ion implantation with given implantation conditions. A patterned implantation mask may be formed to define selected areas that are exposed for the implantation of ions. The implantation mask may include a layer of an organic photoresist that is applied and patterned to form openings exposing the selected areas and determining, at least in part, the location and horizontal dimensions of the wells 20, 22. The implantation mask has a thickness and stopping power sufficient to block the implantation of ions in masked areas. The implantation conditions (e.g., ion species, dose, kinetic energy) may be selected to tune the electrical and physical characteristics of the wells 20, 22. In an embodiment, the wells 20, 22 may be doped with a concentration of an n-type dopant (e.g., arsenic or phosphorus) to provide n-type conductivity. In an alternative embodiment, the wells 20, 22 may be doped with a concentration of a p-type dopant (e.g., boron) to provide n-type conductivity. The implantation mask may be stripped after forming the wells 20, 22.

The well 20 is positioned beneath an active region including the semiconductor layers 28, 29 belonging to the field-effect transistors 12, 14, and the well 22 is positioned beneath another active region including a different pair of the semiconductor layers 28, 29 belonging to the field-effect transistors 16, 18. A portion of an isolation layer 25 may electrically isolate the adjacent active regions from each other. In an embodiment, the isolation layer 25 may include shallow trench isolation regions formed by patterning trenches with lithography and etching processes, depositing a dielectric material, such as silicon dioxide, to fill the trenches, and planarizing and/or recessing the dielectric material.

The field-effect transistor 12 and the field-effect transistor 16 may include a shared gate electrode 34, and the field-effect transistor 14 and the field-effect transistor 18 may include a shared gate electrode 36. The gate electrode 34 extends longitudinally across the semiconductor layers 28 associated with the field-effect transistor 12 and the field-effect transistor 16, as well as longitudinally across the intervening portion of the isolation layer 25. The gate electrode 34 is positioned on a portion of each semiconductor layer 28. A gate electrode 38 of an adjacent transistor is arranged on the semiconductor layer 28 adjacent to the gate electrode 34. The gate electrode 36 extends longitudinally across the semiconductor layers 29 associated with the field-effect transistor 14 and the field-effect transistor 18, as well as longitudinally across the intervening portion of the isolation layer 25. The gate electrode 36 is positioned on a portion of each semiconductor layer 29 and is located adjacent to the gate electrode 34. A gate electrode 40 of an adjacent transistor is arranged on the semiconductor layer 29 adjacent to the gate electrode 36. The gate electrodes 34, 36 are arranged in a lateral direction between the gate electrode 38 and the gate electrode 40. In an embodiment, the gate electrode 36 may be arranged directly adjacent to the gate electrode 34 without any intervening gate electrodes. The gate electrode 34 overlaps with a portion of each semiconductor layer 28, the gate electrode 36 overlaps with a portion of each semiconductor layer 29, and each pair of the semiconductor layers 28, 29 includes respective portions that are laterally positioned between the gate electrodes 34, 36. Because of the electrical isolation provided by the isolation layer 25, each of the wells 20, 22 can be independently biased during operation of the resistive random-access memory device, which may permit independent control over biasing of the gate electrodes 34, 38 and biasing of the gate electrodes 36, 40.

The gate electrodes 34, 36 and gate electrodes 38, 40 may be formed by depositing a layer stack and patterning the layer stack with photolithography and etching processes. The gate electrodes 34, 36 and gate electrodes 38, 40 may be comprised of a conductor, such as doped polycrystalline silicon (i.e., doped polysilicon). A gate dielectric layer 35 comprised of an electrical insulator, such as silicon dioxide, may be disposed between the gate electrodes 34, 38 and the semiconductor layers 28, as well as between the gate electrodes 36, 40 and the semiconductor layers 29.

Caps 33, which may be sections of a hardmask used to pattern the gate electrodes 34, 36, 38, 40, are positioned on the top surface of the patterned gate electrodes 34, 36, 38, 40. The caps 33 may be comprised of a dielectric material, such as silicon nitride, that is an electrical insulator.

Figure 3:
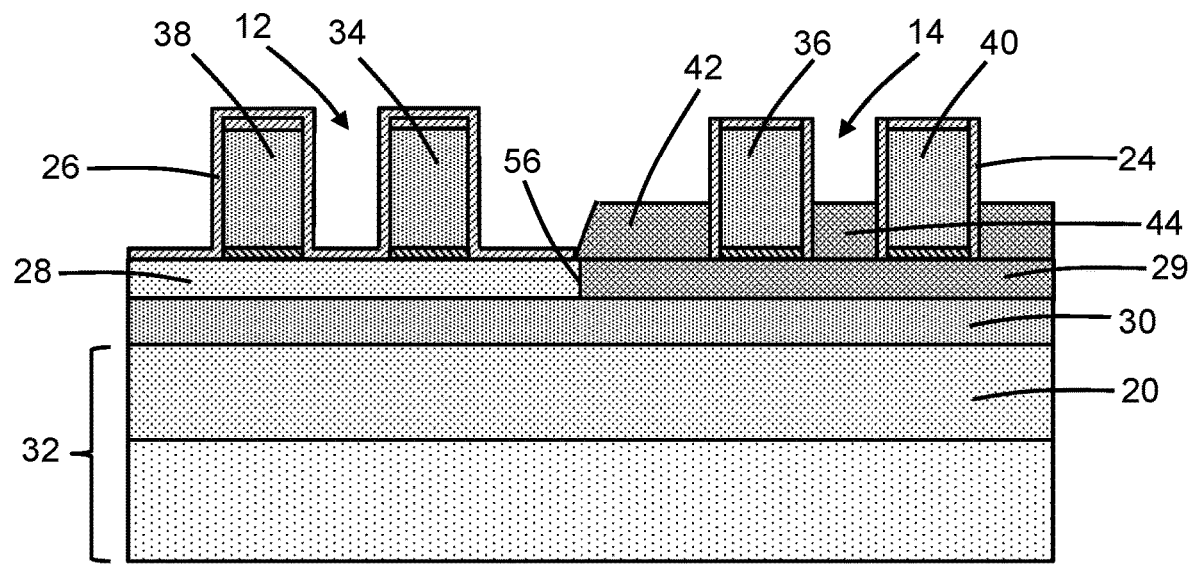
FIGS. 3, 3A are cross-sectional views of the structure at a fabrication stage subsequent to FIG. 1.
Figure 3A:
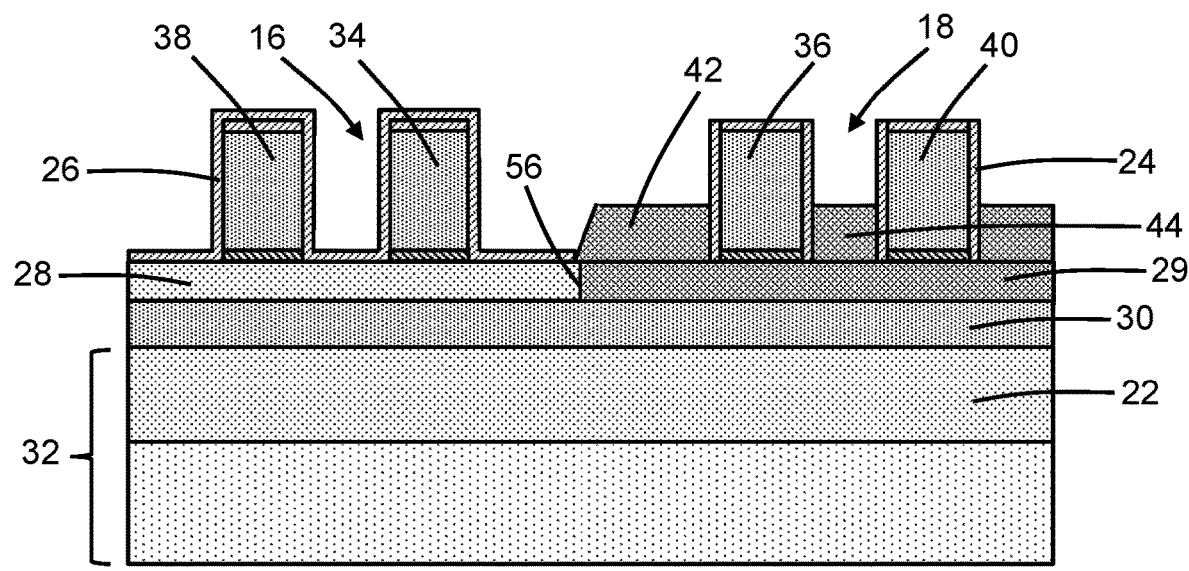

With reference to FIGS. 3, 3A in which like reference numerals refer to like features in FIGS. 2, 2A and at a subsequent fabrication stage, spacers 24 may be formed on the sidewalls of the gate electrodes 36, 40, and a protective coating 26 may be formed over the semiconductor layer 28 and gate electrodes 34, 38. The spacers 24 and protective coating 26 may be comprised of a dielectric material, such as silicon nitride, that is conformally deposited, masked over the semiconductor layers 28 and gate electrodes 34, 38, and anisotropically etched to form the spacers 24. Portions of the semiconductor layers 29 are exposed adjacent to the spacers 24 and the gate electrodes 36, 40 and other portions of the semiconductor layers 29 are overlapped by the spacers 24 and the gate electrodes 36, 40.

The field-effect transistors 14, 18 may include raised semiconductor layers 42, 44 formed on the respective exposed portions of the semiconductor layers 29. The raised semiconductor layers 42 are positioned adjacent to the semiconductor layers 28 and gate electrode 34, which are covered by the protective coating 26. The raised semiconductor layers 42, 44 may define source/drain regions of the field-effect transistors 14, 18. As used herein, the term "source/drain region" means a doped region of semiconductor material that can function as either a source or a drain of a field-effect transistor. In an embodiment, the raised semiconductor layers 42, 44 may contain an epitaxially-grown semiconductor material, such as silicon-germanium, doped with, for example, a p-type dopant (e.g., boron). In an embodiment, the raised semiconductor layers 42 may be faceted proximate to the respective interfaces 56 between the semiconductor layers 28 and the semiconductor layers 29. In an embodiment, the field-effect transistors 14, 18 may be p-type field-effect transistors characterized by p-type source/drain regions.

Figure 4:
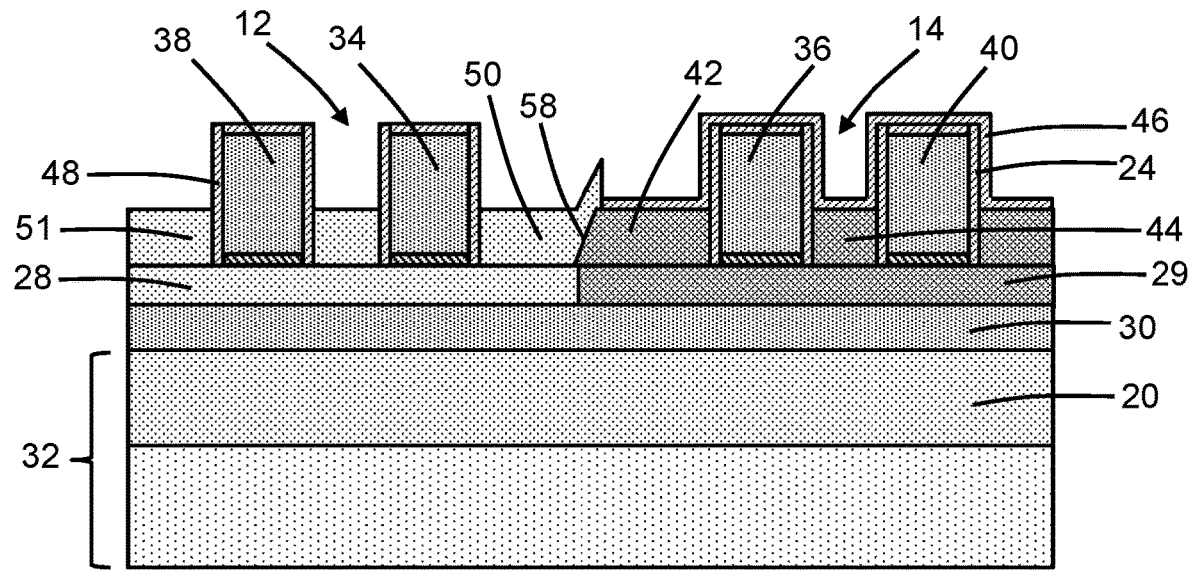
FIGS. 4, 4A are cross-sectional views of the structure at a fabrication stage subsequent to FIGS. 3, 3A.
Figure 4A:
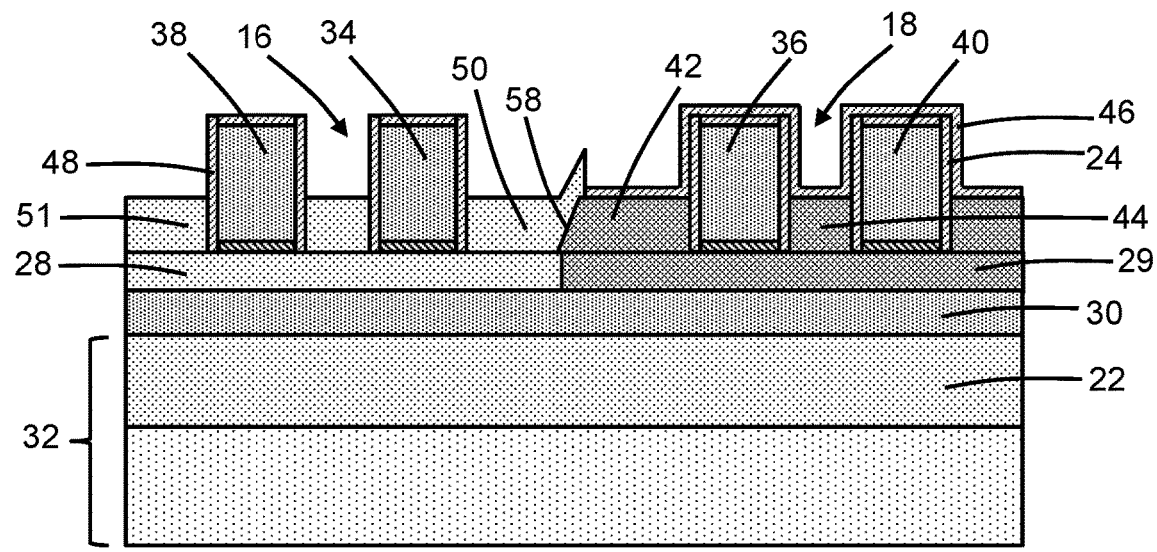

With reference to FIGS. 4, 4A in which like reference numerals refer to like features in FIGS. 3, 3A and at a subsequent fabrication stage, a protective coating 46 may be formed over the raised semiconductor layers 42, 44 and gate electrodes 36, 40 that are disposed on the semiconductor layers 29. The protective coating 46 may be comprised of a dielectric material, such as silicon nitride, that is conformally deposited and patterned by lithography and etching processes. The protective coating 26 (FIGS. 3, 3A) may be anisotropically etched to form spacers 48 on the sidewalls of the gate electrodes 34, 38 and to expose portions of the semiconductor layers 28 adjacent to the gate electrodes 34, 38 and the spacers 48. Other portions of the semiconductor layers 28 are overlapped by the gate electrodes 34, 38 and the spacers 48.

The field-effect transistors 12, 16 may include raised semiconductor layers 50, 51 formed on the respective exposed portions of the semiconductor layers 28. The raised semiconductor layers 50 are positioned adjacent to the semiconductor layers 29, the gate electrode 36, and the raised semiconductor layers 42. In an embodiment, the raised semiconductor layers 50 may adjoin or abut the raised semiconductor layers 42. In an embodiment, the raised semiconductor layers 50 may directly contact the raised semiconductor layers 42.

The raised semiconductor layers 50, 51 may define source/drain regions of the field-effect transistors 12, 16. In an embodiment, the raised semiconductor layers 50, 51 may be characterized by an opposite conductivity type from the raised semiconductor layers 42, 44. In an embodiment, the raised semiconductor layers 50, 51 may contain an epitaxially-grown semiconductor material, such as silicon, doped with, for example, an n-type dopant (e.g., arsenic or phosphorus). In an embodiment, the side edge portion of each raised semiconductor layer 50 may be beveled proximate to the respective interfaces 56 between the semiconductor layers 28 and the semiconductor layers 29, and may overlap slightly with a portion of the adjacent raised semiconductor layer 42. Each pair of the raised semiconductors layers 50 and the raised semiconductor layers 42 may abut or adjoin along an interface 58.

In an embodiment, the field-effect transistors 12, 16 may be n-type field-effect transistors characterized by n-type source/drain regions and the field-effect transistors 14, 18 may be p-type field-effect transistors with p-type source/drain regions. The field-effect transistor 12 and the field-effect transistor 14 may have abutting n-type and p-type source/drain regions in the form of, respectively, abutted raised semiconductor layers 42, 50. The field-effect transistor 16 and the field-effect transistor 18 may also have abutting n-type and p-type source/drain regions in the form of, respectively, abutting raised semiconductor layers 42, 50.

The well 20 extends beneath the field-effect transistor 12 and the field-effect transistor 16. A bias can be applied to the well 20 to simultaneously forward bias one of the field-effect transistors (e.g., field-effect transistor 12) and reverse bias the other of the field-effect transistors (e.g., field-effect transistor 16). The well 22 extends beneath the field-effect transistor 14 and the field-effect transistor 18. A bias can be applied to the well 22 to simultaneously forward bias one of the field-effect transistors (e.g., field-effect transistor 14) and reverse bias the other of the field-effect transistors (e.g., field-effect transistor 18). In each instance, the reverse-biasing and forward-biasing are accomplished using the same well, which differs from conventional back-biasing arrangements that rely on distinct wells of different conductivity types to apply a reverse bias and a forward bias to field-effect transistors of complementary types.

Figure 5:
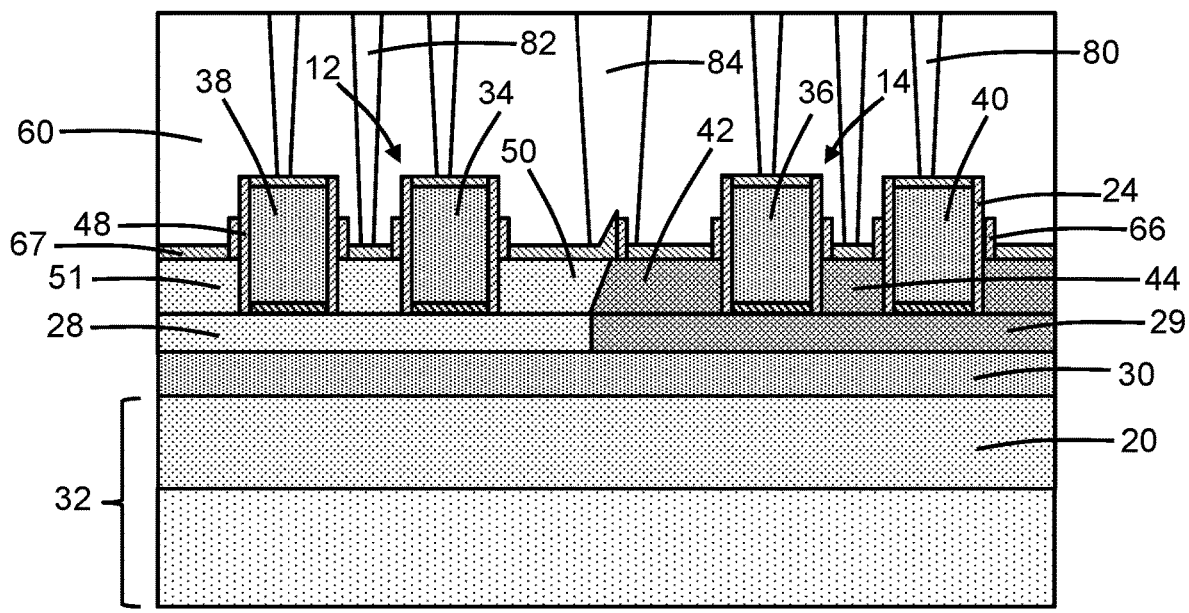
FIGS. 5, 5A are cross-sectional views of the structure at a fabrication stage subsequent to FIGS. 4, 4A.
Figure 5A:
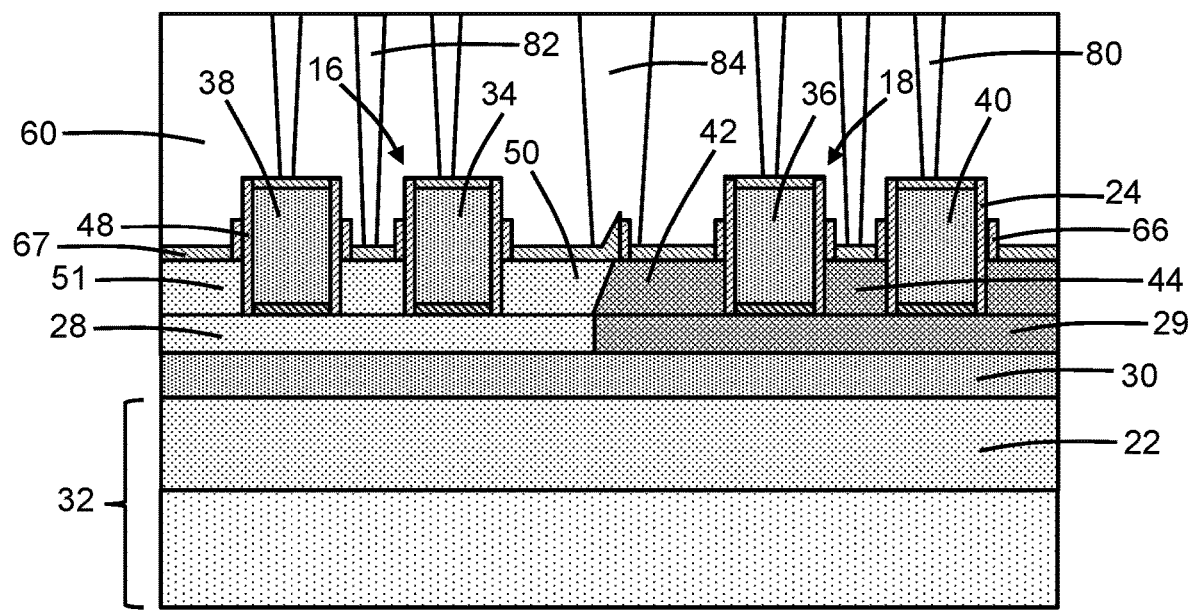

With reference to FIGS. 5, 5A in which like reference numerals refer to like features in FIGS. 4, 4A and at a subsequent fabrication stage, spacers 66 may be formed on the sidewalls of the gate electrodes 34, 36 and the sidewalls of the gate electrodes 38, 40, as well as on the respective beveled side edge portions of the raised semiconductor layers 50. The spacers 66 may be formed by depositing a layer comprised of a dielectric material, such as silicon nitride, and etching the deposited layer with an anisotropic etching process.

Silicide layers 67 may be formed on the gate electrodes 34, 36, the gate electrodes 38, 40, the raised semiconductor layers 42, 44, and the raised semiconductor layers 50, 51. The silicide layers 67 may be formed by a silicidation process that involves one or more annealing steps to form a silicide phase by reacting the constituent semiconductor materials with a deposited layer comprised of a silicide-forming metal, such as nickel. An initial annealing step of the silicidation process may consume all or part of the silicide-forming metal to form the silicide layers 67. Following the initial annealing step, any non-reacted silicide-forming metal may be removed by wet chemical etching. The silicide layers 67 may then be subjected to an additional annealing step at a higher temperature to form a lower-resistance silicide phase. In an embodiment, the beveled side edge portion of each raised semiconductor layer 50 may be fully converted to silicide.

The silicide layer 67 that overlaps with the raised semiconductor layer 42 and the raised semiconductor layer 50 of the field-effect transistors 12, 14 provides a physical and electrical connection between the source/drain regions of the field-effect transistors 12, 14 that is in addition to the connection that may be provided by the abutment of the raised semiconductor layer 42 with the raised semiconductor layer 50. Similarly, the silicide layer 67 that overlaps with the raised semiconductor layer 42 and the raised semiconductor layer 50 of the field-effect transistors 16, 18 provides a connection between source/drain regions of the field-effect transistors 16, 18 that is in addition to the connection that may be provided by the abutment of the raised semiconductor layer 42 with the raised semiconductor layer 50. Each of these silicide layers 67 overlaps with one of the interfaces 58 (FIGS. 4, 4A).

A dielectric layer 60 may be formed over the field-effect transistors 12, 14, 16, 18. Gate contacts 80 may be formed in the dielectric layer 60 that are physically and electrically connected to the silicide layers 67 on the gate electrodes 34, 36, 38, 40. Source/drain contacts 82 may be formed in the dielectric layer 60 that are physically and electrically connected to the silicide layers 67 on the raised semiconductor layers 44 and the raised semiconductor layers 51. Source/drain contacts 84 may be formed in the dielectric layer 60 that are connected to physically and electrically connected to the silicide layers 67 on the different pairs of abutting raised semiconductor layers 42 and raised semiconductor layers 50. One of the spacers 66 may be embedded inside each of the source/drain contacts 84. Each source/drain contact 84 may be located over one of the interfaces 58 (FIGS. 4, 4A) between the semiconductor layers 28 and the semiconductor layers 29. The contacts 80, 82, 84 may be comprised of a metal, such as tungsten, and the dielectric layer 60 may be comprised of a dielectric material, such as silicon dioxide, that is an electrical insulator.

Figure 6:
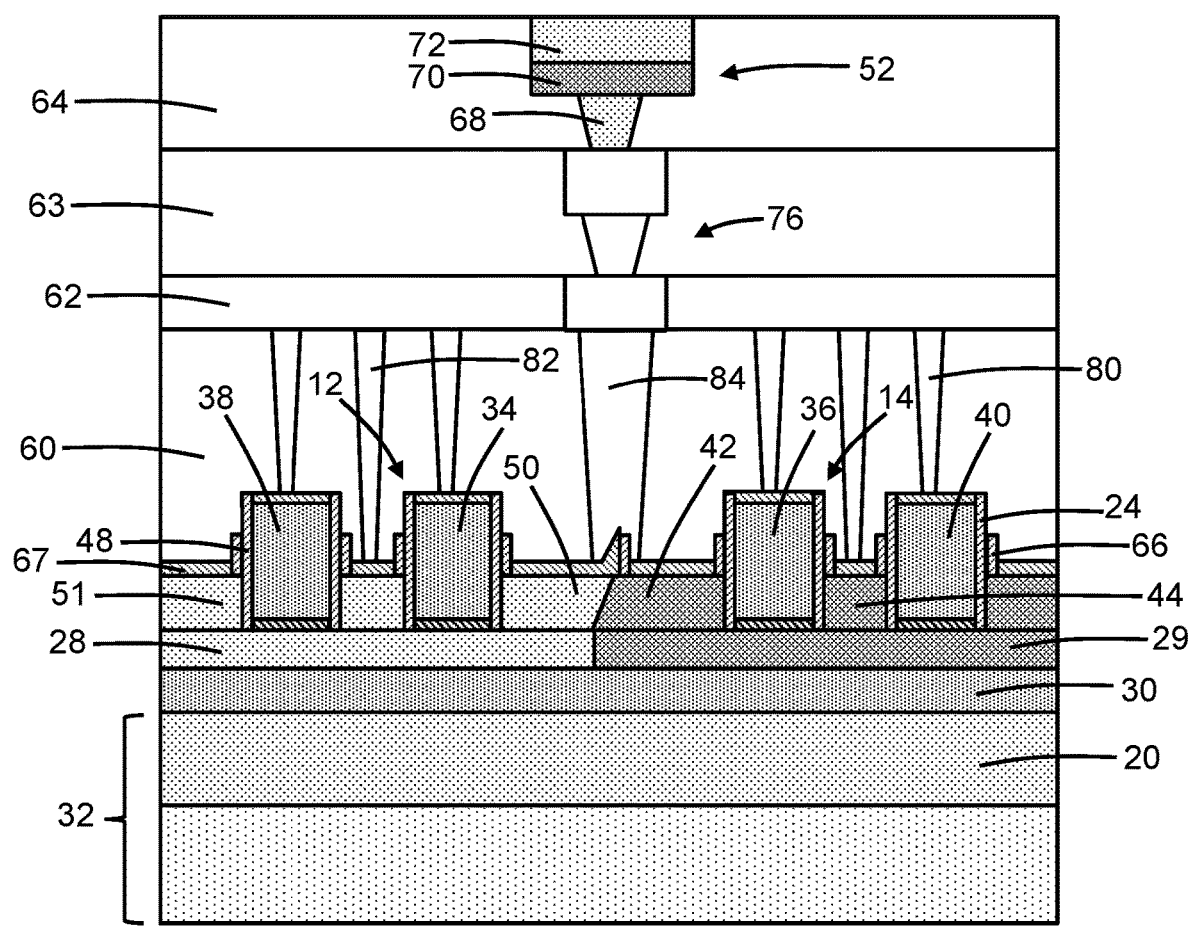
FIGS. 6, 6A are cross-sectional views of the structure at a fabrication stage subsequent to FIGS. 5, 5A.
Figure 6A:
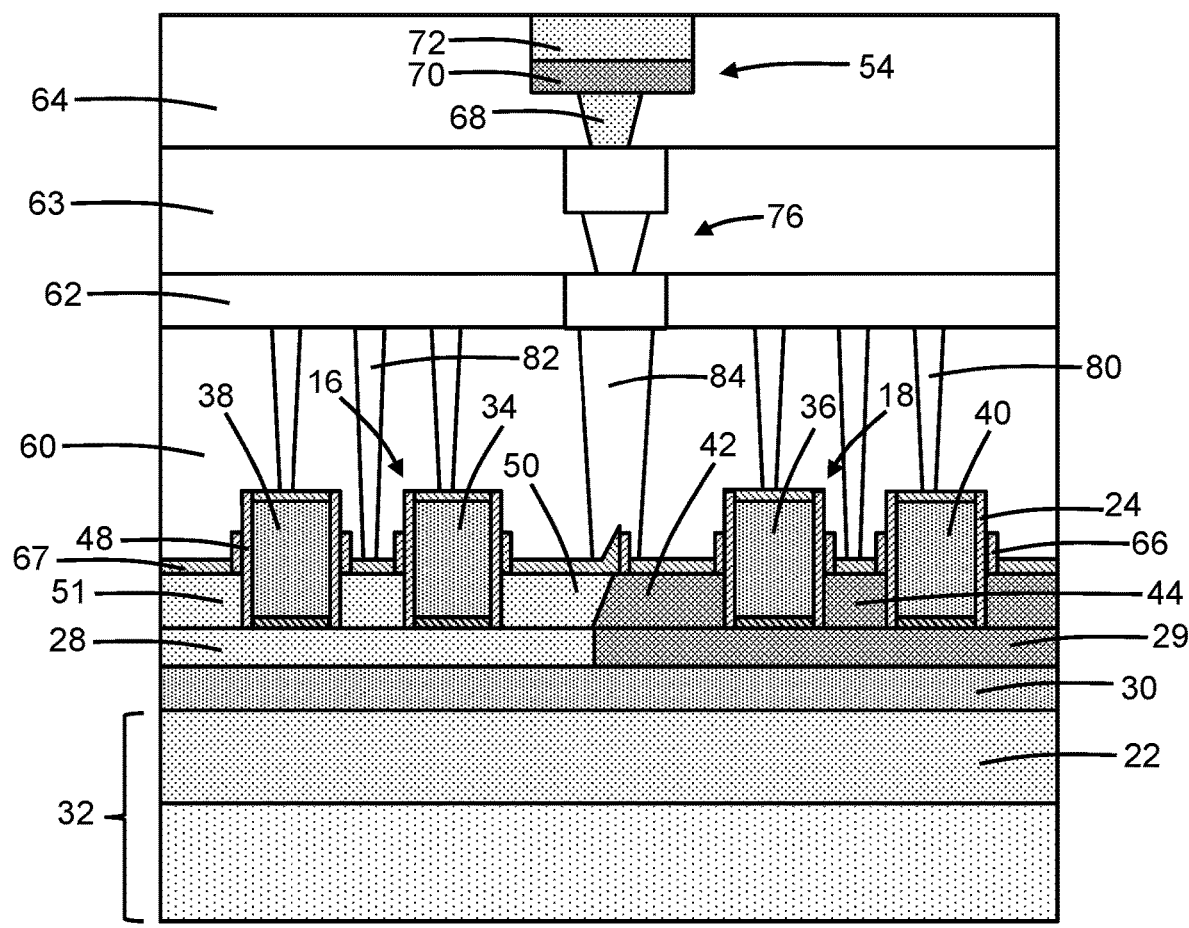

With reference to FIG. 6, 6A in which like reference numerals refer to like features in FIGS. 5, 5A and at a subsequent fabrication stage, an interconnect structure may be formed over the field-effect transistors 12, 14, 16, 18. The interconnect structure may include dielectric layers 62, 63, 64 arranged in a layer stack defining multiple metallization levels, and may also be considered to include the dielectric layer 60 and contacts 80, 82, 84. The dielectric layers 62, 63, 64 may be comprised of a dielectric material, such as silicon dioxide or a low-k dielectric material, that is an electrical insulator.

Resistive memory elements 52, 54 may be formed as representative non-volatile memory elements in the interconnect structure. The resistive memory element 52 may be coupled to the field-effect transistors 12, 14 and the resistive memory element 54 may be coupled to the field-effect transistors 16, 18 to define different bitcells of the resistive random-access memory device. The field-effect transistors 12, 14 provide pass-gate or access transistors for accessing the bitcell including the resistive memory element 52, and the field-effect transistors 12, 14 provide pass-gate or access transistors for accessing the bitcell including the resistive memory element 54. The gate electrodes 34, 36, 38, 40 may define word lines of the resistive random-access memory device. The word lines may be connected by a bus to peripheral circuits that include, for example, word line drivers. The raised semiconductor layer 44 and the raised semiconductor layer 51 of each transistor pair may be connected to bit lines of the resistive random-access memory device. The bit lines may be connected by a bus to peripheral circuits that include, for example, bit line drivers, a multiplexer, and a sense amplifier.

Each of the resistive memory elements 52, 54 includes a bottom electrode 68, a top electrode 72, and a switching layer 70 positioned between the bottom electrode 68 and the top electrode 72. The bottom electrodes 68 may define respective cathodes of the resistive memory elements 52, 54, and the top electrodes 72 may define respective anodes of the resistive memory elements 52, 54. Each bottom electrode 68 comprised of a metal, such as tantalum, titanium nitride, tantalum nitride, or a combination thereof. Each switching layer 70 may be comprised of a metal oxide, such as hafnium oxide, magnesium oxide, tantalum oxide, titanium oxide, or aluminum oxide, or a dielectric material, such as silicon nitride or silicon dioxide. Each top electrode 72 may be comprised of a metal, such as tungsten, titanium nitride, tantalum nitride, or platinum. The interconnect structure may include vertical interconnections 76 defined by a stack of via plugs and metal features that physically and electrically connect one of the source/drain contacts 84 and the abutted raised semiconductors layers 42, 50 of the field-effect transistors 12, 14 to the bottom electrode 68 of the resistive memory element 52, and one of the source/drain contacts 84 and the abutted raised semiconductors layers 42, 50 of the field-effect transistors 16, 18 to the bottom electrode 68 of the resistive memory element 54.

The structure 10 for the resistive random-access memory device may be expanded to include additional field-effect transistors and additional resistive memory elements. In that regard, the expanded array may include additional wells arranged adjacent to the wells 20, 22, additional pairs of semiconductor layers 28, 29, and additional gate electrodes arranged adjacent to the gate electrodes 34, 36, 38, 40. The number of resistive memory elements in the expanded array may be increased commensurate with the increased number of field-effect transistors. In an alternative embodiment, the resistive memory elements 52, 54 may be replaced by different non-volatile memory elements, such as magnetoresistive memory elements.

The field-effect transistors 12, 14 and the field-effect transistors 16, 18 may operate in a transmission-gate mode that permits a reduction in the operating voltages for accessing the resistive memory elements 52, 54 in comparison with conventional bitcells including only a single access transistor. For example, the voltages applied to the gate electrodes 34, 36, 38, 40 may be reduced when accessing the resistive memory elements 52, 54 during an erase operation in contrast to the gate voltages needed in conventional single-transistor constructions during an erase operation.

Figure 7:
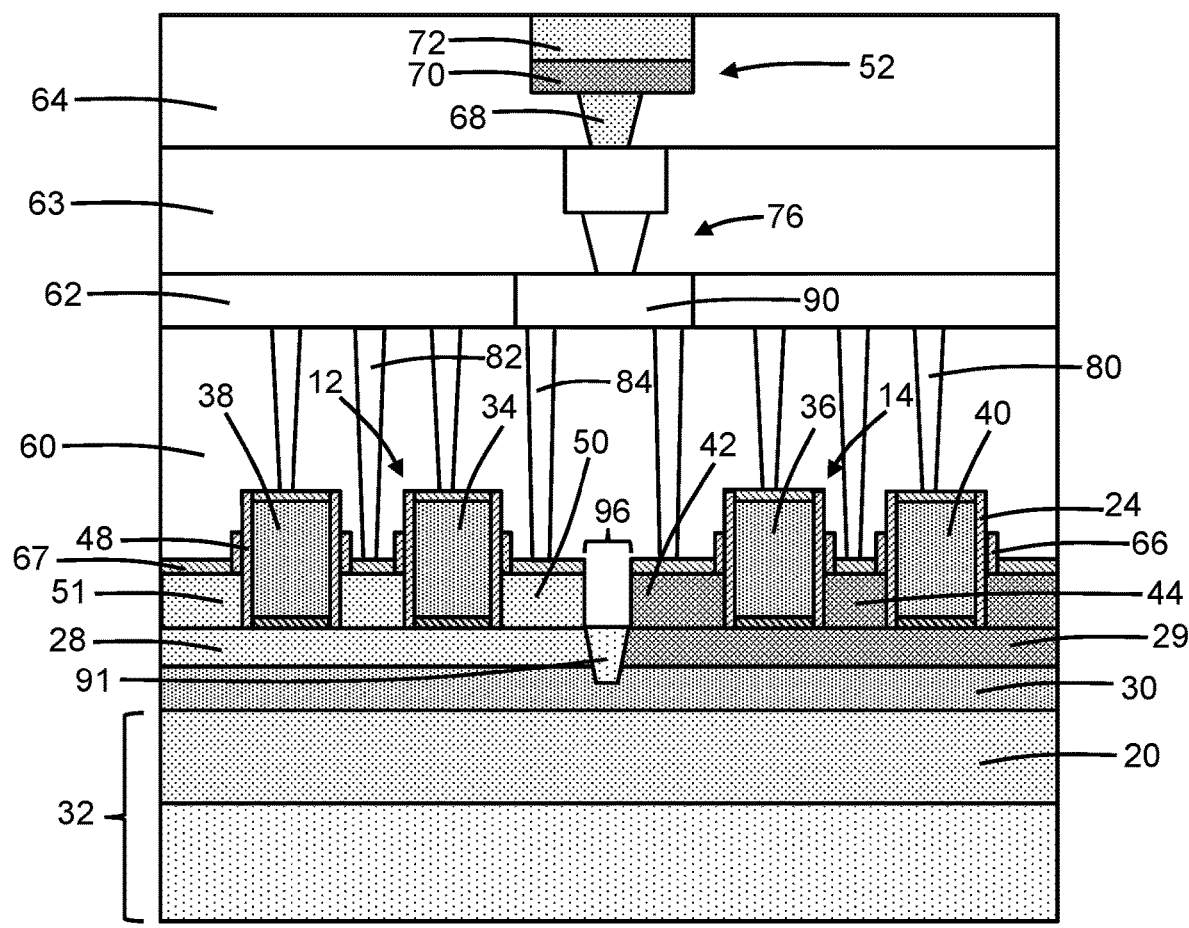
FIGS. 7, 7A are cross-sectional views of a structure in accordance with alternative embodiments of the invention.
Figure 7A:
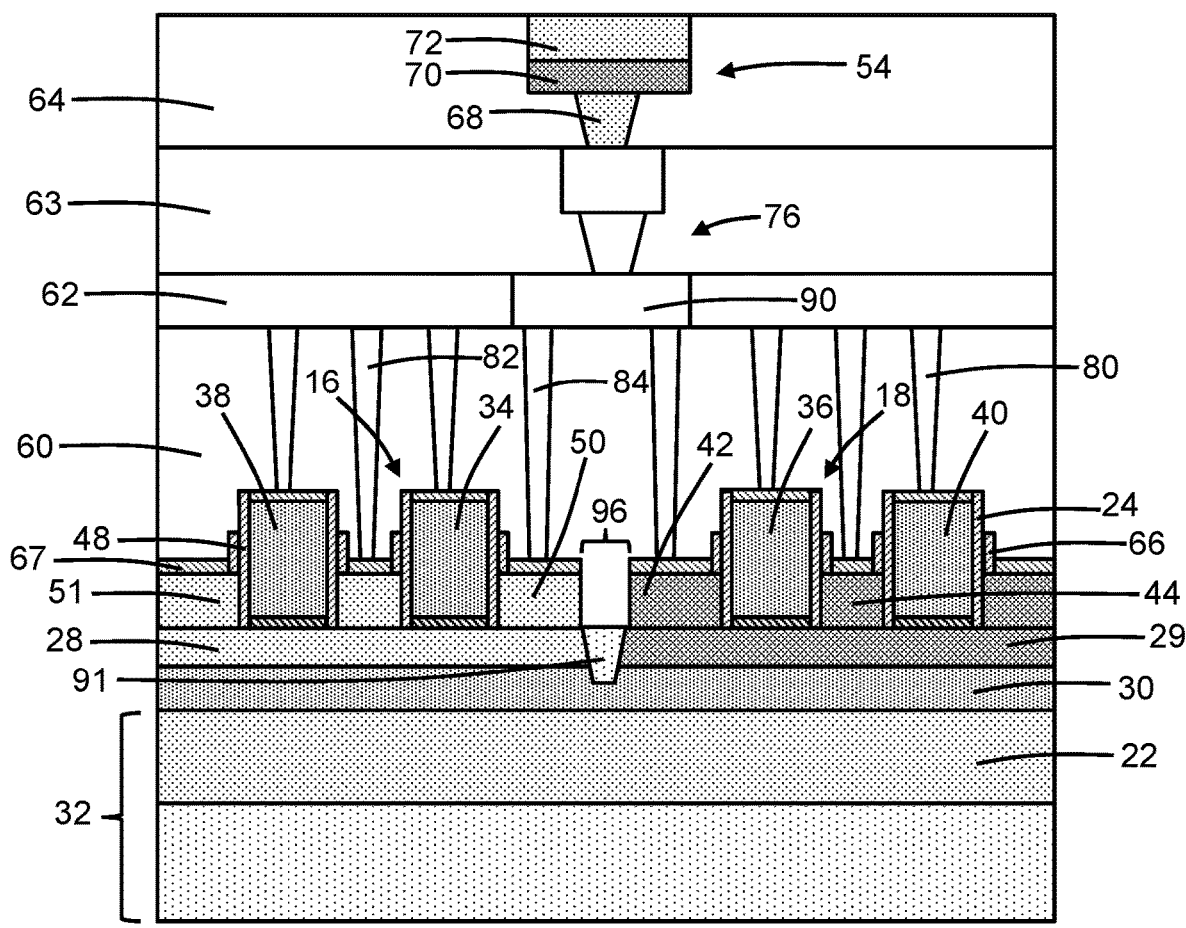

With reference to FIGS. 7, 7A and in accordance with alternative embodiments of the invention, the semiconductor layers 28, 50 and the semiconductor layers 29, 42 may be formed without abutment of the respective side edge portions. As a result, a gap 96 may exist between the adjacent side edge portions of the semiconductor layers 28, 50 and the adjacent side edge portions of the semiconductor layers 29, 42. An isolation region 91 may extend through the semiconductor layers 28, 29 to provide a separation creating the gap 96.

A local interconnect 90 may be formed as a metal feature in the interconnect structure and may be configured to bridge across the gap 96. Each local interconnect 90 may be physically and electrically connected by the source/drain contacts 84 individually to each adjacent pair of the raised semiconductor layers 42, 50. In an alternative embodiment, the utilization of the local interconnect 90 may permit the elimination of the dielectric layer 30 between the semiconductor layers 28, 29 and the substrate 32 such that the field-effect transistors 12, 14, 16, 18 are formed using the substrate 32.

Figure 8:
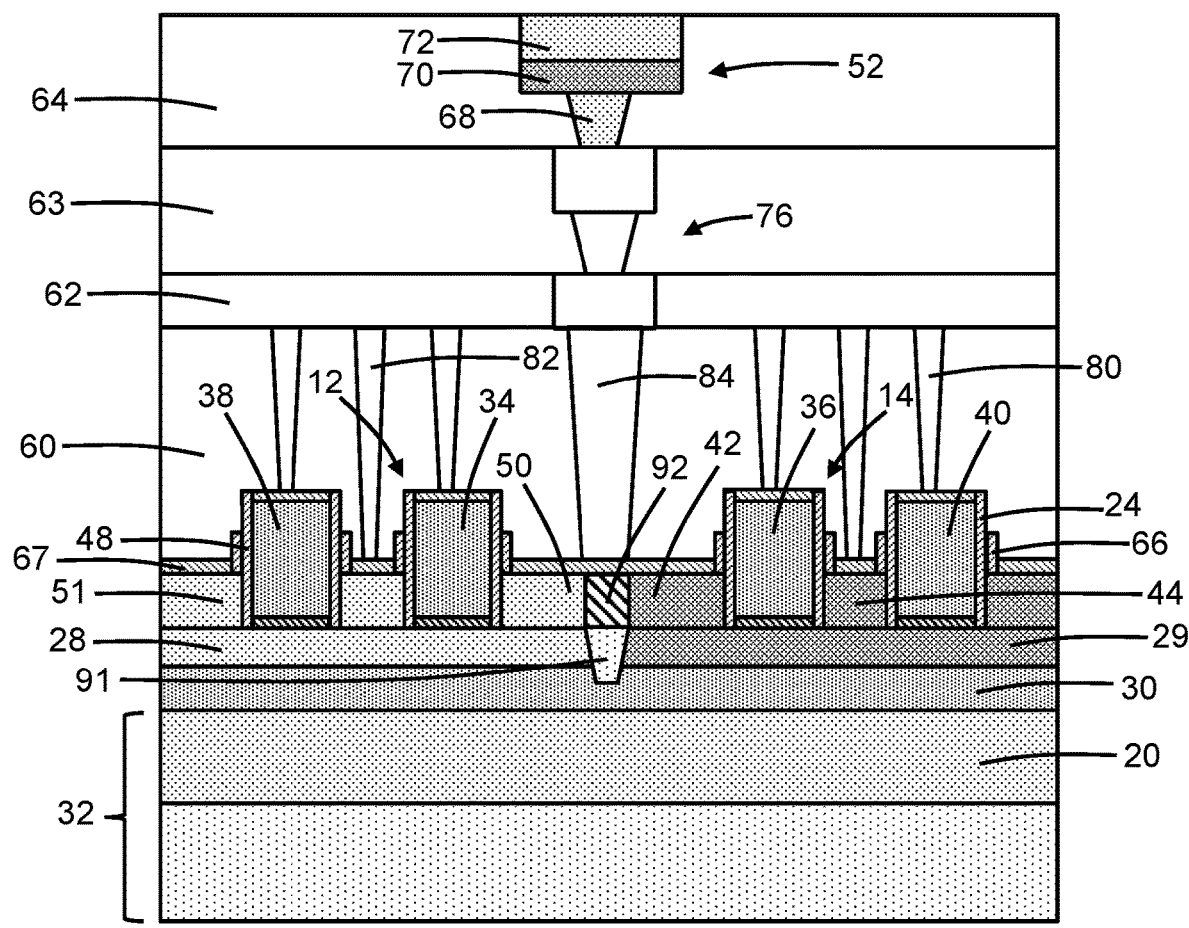
FIGS. 8, 8A are cross-sectional views of a structure in accordance with alternative embodiments of the invention.
Figure 8A:
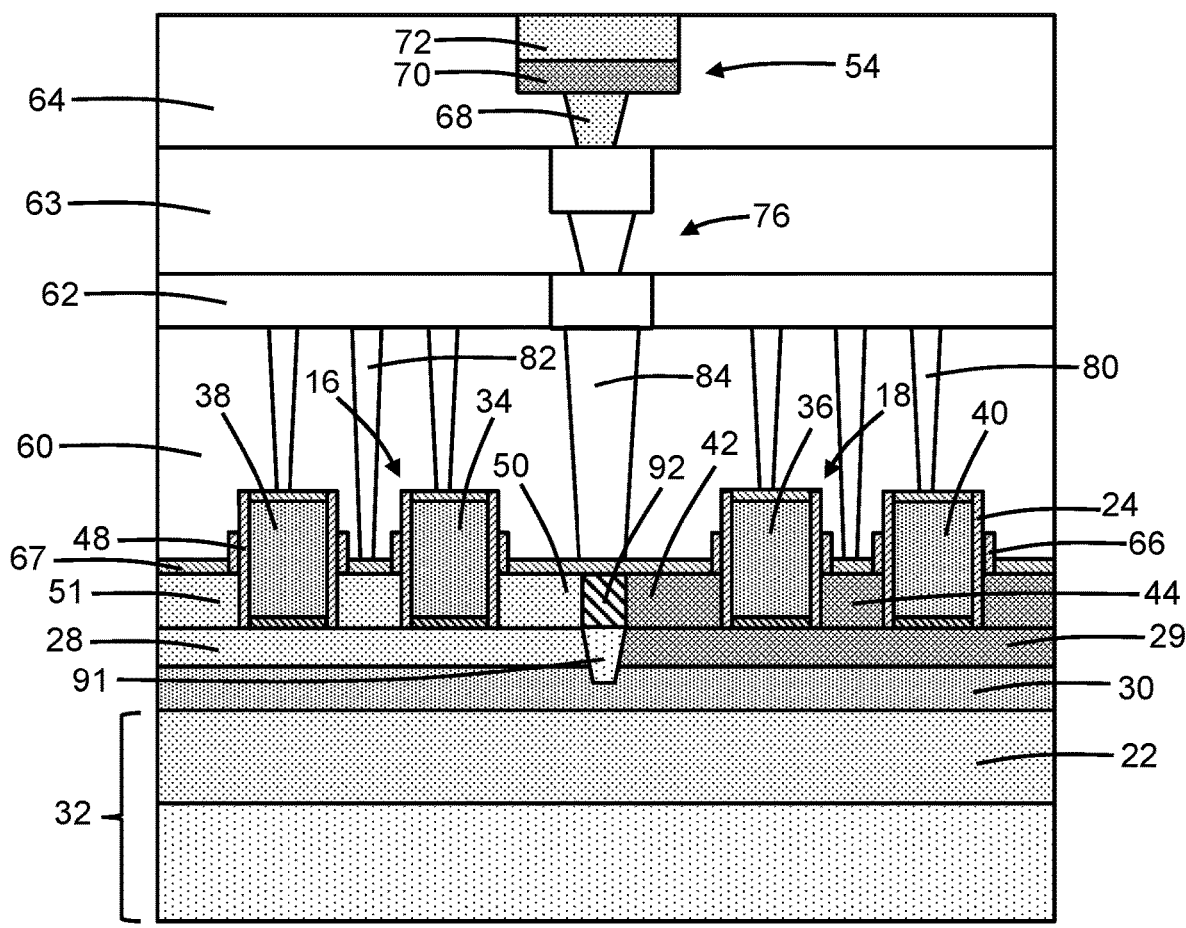

With reference to FIGS. 8, 8A and in accordance with alternative embodiments of the invention, a semiconductor layer 92 may be formed over the isolation region 91 to bridge the gap 96 (FIGS. 7, 7A) and, thereby, physically and electrically connect each pair of the raised semiconductor layers 42, 50. In an embodiment, the semiconductor layer 92 may be formed by an epitaxial growth process. The silicide layer 67 may include a portion formed on the semiconductor layer 92, as well as a portion formed on the raised semiconductor layer 42 and a portion formed on the raised semiconductor layer 50.

Figure 9:
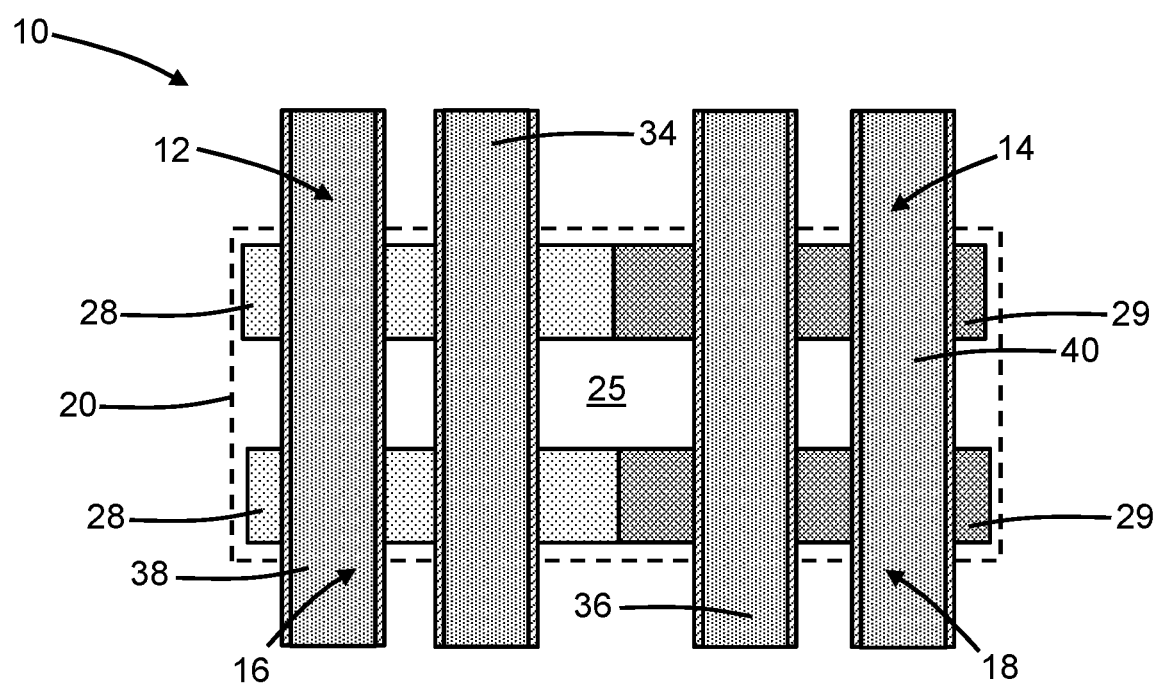
FIG. 9 is a top view of a structure in accordance with alternative embodiments of the invention.

With reference to FIG. 9 and in accordance with alternative embodiments of the invention, the well 20 may be positioned beneath the active region including the pair of semiconductor layers 28, 29 belonging to the field-effect transistors 12, 14, and also positioned beneath the active region including the pair of semiconductor layers 28, 29 belonging to the field-effect transistors 16, 18. A bias can be applied to the shared well 20 to simultaneously forward bias the field-effect transistors (e.g., field-effect transistors 12, 14) and reverse bias the field-effect transistors (e.g., field-effect transistor 16, 18).

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
   a substrate;
   a dielectric layer on the substrate;
   a first field-effect transistor including a first semiconductor layer over the dielectric layer and a first gate electrode;
   a second field-effect transistor including a second semiconductor layer over the dielectric layer and a second gate electrode adjacent to the first gate electrode, the second semiconductor layer electrically connected to the first semiconductor layer; and
   a well in the substrate beneath the first field-effect transistor and the second field-effect transistor,
   wherein the first semiconductor layer and the second semiconductor layer are positioned between the first gate electrode and the second gate electrode, the dielectric layer is positioned between the well and the first semiconductor layer, and the dielectric layer is positioned between the well and the second semiconductor layer.

2. The structure of claim 1 wherein the first semiconductor layer has p-type conductivity, the second semiconductor layer has n-type conductivity, and the well has p-type conductivity.

3. The structure of claim 1 wherein the first semiconductor layer has p-type conductivity, the second semiconductor layer has n-type conductivity, and the well has n-type conductivity.

4. A structure comprising:
   a substrate;
   a dielectric layer on the substrate;
   a first field-effect transistor including a first semiconductor layer over the dielectric layer and a first gate electrode;
   a second field-effect transistor including a second semiconductor layer over the dielectric layer and a second gate electrode adjacent to the first gate electrode, the second semiconductor layer adjoining the first semiconductor layer along an interface; and
   a well in the substrate beneath the first field-effect transistor and the second field-effect transistor,
   wherein the dielectric layer is positioned between the well and the first semiconductor layer, and the dielectric layer is positioned between the well and the second semiconductor layer.

5. The structure of claim 4 further comprising:
   a silicide layer on the first semiconductor layer and the second semiconductor layer, the silicide layer extending across the interface.

6. The structure of claim 4 further comprising:
   a memory element connected to the first semiconductor layer and the second semiconductor layer.

7. The structure of claim 1 wherein the second semiconductor layer is spaced from the first semiconductor layer by a gap, and further comprising:
   a third semiconductor layer extending across the gap from the first semiconductor layer to the second semiconductor layer.

8. The structure of claim 7 further comprising:
   a memory element connected to the third semiconductor layer.

9. The structure of claim 1 further comprising:
   an interconnect structure over the first field-effect transistor and the second field-effect transistor, the interconnect structure including a metal feature, a first contact connecting the first semiconductor layer to the metal feature, and a second contact connecting the second semiconductor layer to the metal feature.

10. The structure of claim 9 further comprising:
    a memory element connected to the metal feature.

11. The structure of claim 1 further comprising:
    a memory element connected to the first semiconductor layer and the second semiconductor layer.

12. The structure of claim 11 further comprising:
    an interconnect structure over the first field-effect transistor and the second field-effect transistor, the interconnect structure including a plurality of dielectric layers in a layer stack,
    wherein the memory element is positioned in the interconnect structure.

13. The structure of claim 11 wherein the memory element includes a first electrode connected to the first semiconductor layer and the second semiconductor layer, a second electrode, and a switching layer positioned between the first electrode and the second electrode.

14. A structure comprising:
a substrate;
a dielectric layer on the substrate;
a first field-effect transistor including a first semiconductor layer over the dielectric layer and a first gate electrode;
a second field-effect transistor including a second semiconductor layer over the dielectric layer and a second gate electrode adjacent to the first gate electrode, the second semiconductor layer electrically connected to the first semiconductor layer; and
a well in the substrate beneath the first field-effect transistor and the second field-effect transistor,
wherein the dielectric layer is positioned between the well and the first semiconductor layer, and the dielectric layer is positioned between the well and the second semiconductor layer, the first field-effect transistor includes a third semiconductor layer between the first semiconductor layer and the dielectric layer, and the second field-effect transistor includes a fourth semiconductor layer between the second semiconductor layer and the dielectric layer.

15. The structure of claim 14 wherein the third semiconductor layer comprises single-crystal silicon-germanium, and the fourth semiconductor layer comprises single-crystal silicon.

16. The structure of claim 14 wherein the first semiconductor layer is positioned on a first portion of the third semiconductor layer, and the second semiconductor layer is positioned on a first portion of the fourth semiconductor layer.

17. The structure of claim 14 wherein the first gate electrode overlaps with a second portion of the third semiconductor layer, and the second gate electrode overlaps with a second portion of the fourth semiconductor layer.

18. The structure of claim 4 wherein the first field-effect transistor includes a third semiconductor layer between the first semiconductor layer and the dielectric layer, the second field-effect transistor includes a fourth semiconductor layer between the second semiconductor layer and the dielectric layer, the third semiconductor layer comprises single-crystal silicon-germanium, and the fourth semiconductor layer comprises single-crystal silicon.

19. The structure of claim 4 wherein the first field-effect transistor includes a third semiconductor layer between the first semiconductor layer and the dielectric layer, the second field-effect transistor includes a fourth semiconductor layer between the second semiconductor layer and the dielectric layer, the third semiconductor layer comprises single-crystal silicon-germanium, and the fourth semiconductor layer comprises single-crystal silicon.

* * * * *